(12) United States Patent
Blackmon et al.

(10) Patent No.: US 6,188,627 B1
(45) Date of Patent: Feb. 13, 2001

(54) METHOD AND SYSTEM FOR IMPROVING DRAM SUBSYSTEM PERFORMANCE USING BURST REFRESH CONTROL

(75) Inventors: Herman Lee Blackmon, Rochester; Robert Allen Drehmel, Goodhue; Kent Harold Haselhorst, Byron; William Paul Hovis; James Anthony Marcella, both of Rochester, all of MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/374,200

(22) Filed: Aug. 13, 1999

(51) Int. Cl.[7] ........................................................ G11C 7/00
(52) U.S. Cl. .......................... 365/222; 365/233; 365/236
(58) Field of Search ................................. 365/222, 233, 365/230.06, 236

(56) References Cited

U.S. PATENT DOCUMENTS

| 5,345,577 | * | 9/1994 | Chan et al. ............................ 395/425 |
| 5,392,251 | * | 2/1995 | Manning ................................ 365/222 |
| 5,539,703 | * | 7/1996 | Manning ................................ 365/222 |
| 5,583,818 | * | 12/1996 | You et al. ............................... 365/222 |
| 5,715,206 | * | 2/1998 | Lee et al. ............................... 365/222 |

\* cited by examiner

*Primary Examiner*—David Nelms
*Assistant Examiner*—Gene N. Auduong
(74) *Attorney, Agent, or Firm*—Felsman, Bradley, Vaden, Gunter & Dillon

(57) ABSTRACT

A method and system for improving DRAM performance using burst refresh control reduces the overhead associated with refreshing DRAM in a computer system, making the memory more available to the devices that access it. Limiting the burst cycle to less than the entire DRAM array provides a lower latency than existing full DRAM burst techniques.

17 Claims, 5 Drawing Sheets

METHOD AND SYSTEM FOR IMPROVING DRAM SUBSYSTEM PERFORMANCE USING BURST REFRESH CONTROL

BACKGROUND OF THE INVENTION

1. Technical Field

The present invention generally relates to computer memory subsystems, and more particularly, to a DRAM (Dynamic Random Access Memory) subsystem in which refresh requests cause the refresh of more than one row or column in the DRAM, but not the entire DRAM.

2. Description of Related Art

DRAM subsystems are well known in the art. They are high density memory subsystems comprised usually of integrated circuits containing millions of memory cells. The density of these types of memories are much higher than those for so-called static memories, but with a disadvantage: the memory cells must be accessed at a certain minimum frequency or data errors will occur due to the limited storage time of the cell.

A typical DRAM cell uses the gate capacitance of one or more field-effect transistors to provide the storage of a binary state. The charge on this capacitor will eventually leak and the DRAM cell may change state, causing an incorrect bit to be set or reset in memory. This problem is typically solved by a refresh scheme which allows the gate of the field-effect transistors to be recharged according to the value stored in the cell, before sufficient discharge has occurred to cause an error.

DRAM circuits are arranged in a 2-dimensional matrix, typically having an equal number of cells in columns and rows. A sense amplifier is attached to each column or row, depending on the organization, which senses the output of a cell being accessed and buffers the value to a usable level for binary output. This sense amplifier output is coupled back to the cell capacitance in order to restore the charge to maintain the correct cell state.

During a refresh cycle, the output of the sense amplifier is fed back to the cell state to the cell input, causing the cell capacitance to be recharged, effectively "refreshing" the voltage on the cell capacitance. Since there is a sense amplifier for each column or row, an entire row or column of the DRAM can be refreshed in one cycle. Therefore, the refresh system only has to go through all the addresses in the other axis in order to completely refresh the DRAM.

The DRAM integrated circuits typically provide an internal counter so that external circuitry is not needed to generate the addresses. So, in order to refresh a modern DRAM, just the RAS (Row Address Select) or CAS (Column Address Select) signal must be pulsed for the number of cells in the opposite axis.

However, the DRAM is unavailable while this operation is occurring, taking system bandwidth because a processor or other memory reading or writing device may have to wait for the refresh cycle to complete. In addition, the overhead associated with acquiring the bus for a refresh cycle—locking out other bus users, is typically significant with respect to the total length of the refresh cycles themselves.

In a typical DRAM memory system, one processor usually has control of the memory at a given time. Address lines and data lines are driven by the processor or buffers attached to the processor address and data signals. In order to cause the processor to release the DRAM for use by other devices, the processor usually provides a "hold" signal and a "hold acknowledge signal." When the "hold" signal is received, the processor has to complete its present operation, which may be quite long if a slow I/O access is being made or a set of instructions that is "locked" is being executed. Locking is an intentional state in which the processor cannot be interrupted and the bus cannot be taken over, to ensure that memory contents are not modified by other devices or other code while that particular sequence of instructions is being executed.

The result of these mechanisms is to create overhead associated with a refresh cycle. The entire overhead is present for every refresh cycle in a system where a single row or column is refreshed at the refresh interval.

One known solution to this problem is use of a burst refresh cycle. In burst refresh of prior systems, the entire DRAM is refreshed at one time, reducing the overhead required to acquire the bus to one acquisition cycle per complete refresh. This has a disadvantage of creating the longest latency for the other devices or processors that need to use the DRAM while the refresh cycle is occurring.

It would, therefore, be desirable to provide a method and system in which DRAM overhead can be optimized against latency of the array to other requests. A system in which the DRAM is partially refreshed would share the overhead of bus acquisition over more than one refresh cycle, but not lock out memory users, such as processors, for long intervals.

SUMMARY OF THE INVENTION

It is therefore one object of the present invention to provide a method for improving DRAM performance.

It is another object of the present invention to provide a method for improving DRAM performance where refresh overhead is reduced.

It is another object of the present invention to provide a method for improving DRAM performance that does not lock out memory users for long intervals.

The foregoing objects are achieved in a method for improving DRAM performance and further in embodiments of a DRAM refresh system that completes a total refresh cycle in bursts. The method prevents access to a memory by one or more connected devices, generates multiple refresh cycles to refresh a subset of the memory, then restores access to said memory. This method is repeated for the second subset of memory and so on until the entire memory is refreshed. The refresh system includes timer means for generating refresh requests, counter means for counting a quantity of refresh cycles to be produced at each refresh request, and optional register means for programming and storing a burst count, where the burst count determines the quantity of refresh cycles.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 2:
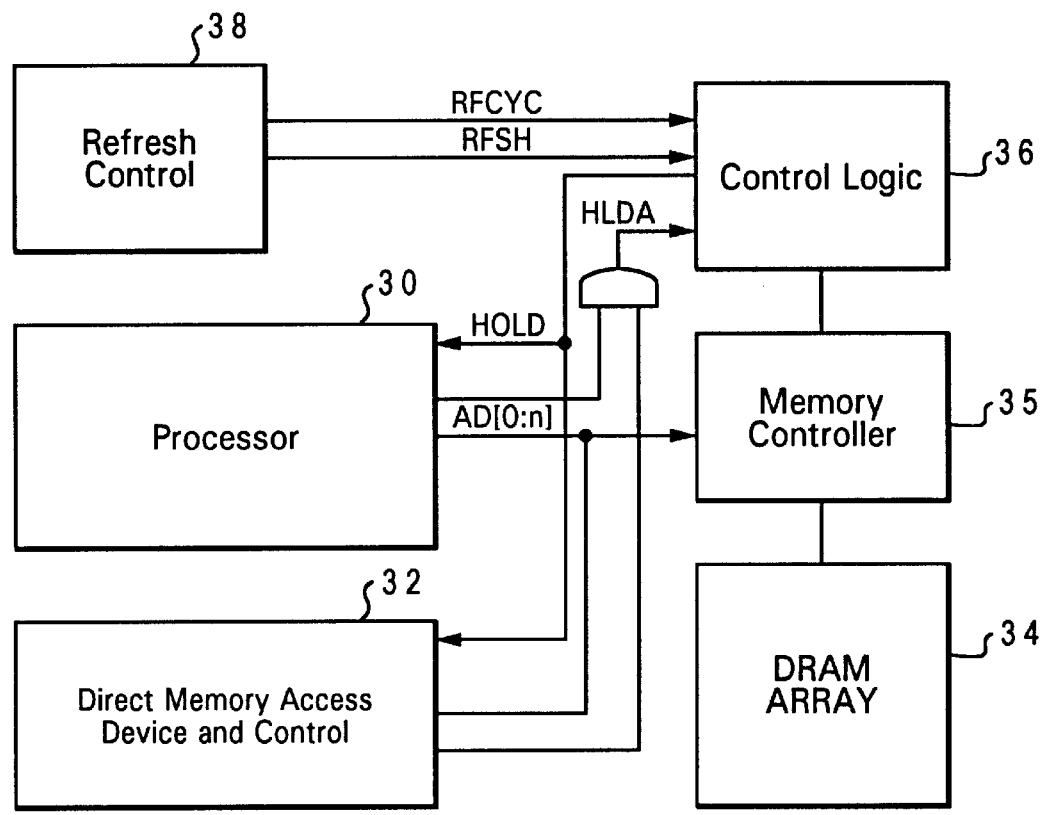
FIG. 2 is an electrical block diagram of a computer system core, including a refresh controller in which the present invention may be practiced.

Referring now to the figures, an in particular to FIG. 2, the core components of an exemplary computer system, in which the present invention can be practiced, are illustrated. Refresh Control 38, provides refresh requests to the system. Control Logic 36 provides a HOLD signal to Processor 30 to acquire the processor address and data bus AD[0:n], so that the refresh cycles may be performed. Processor 30 and Direct Memory Access Device and Control 32, provide signals which are combined in a logical AND fashion to produce a hold acknowledge HLDA indicating to the Control Logic 36, that the address and data bus AD[0:n] is available. Control Logic 36 may then begin a refresh cycle. DRAM Array 34, is refreshed by the action of Control Logic 36 through Memory Controller 35, which will further generate CAS (Column Address Select) and/or RAS signals (Row Address Select) signals within the DRAM array, depending on the particular refresh technique that the DRAM requires. These signals are well known names for signals within the art of DRAM's, but should not be construed to limit the application of these circuits and techniques to other memory implementations requiring refresh of memory.

DRAM array 34 can be memory external to the processor integrated circuit, or can constitute DRAM within a processor such as L1 or L2 cache memory provided in a microprocessor or other program execution device.

Figure 3:
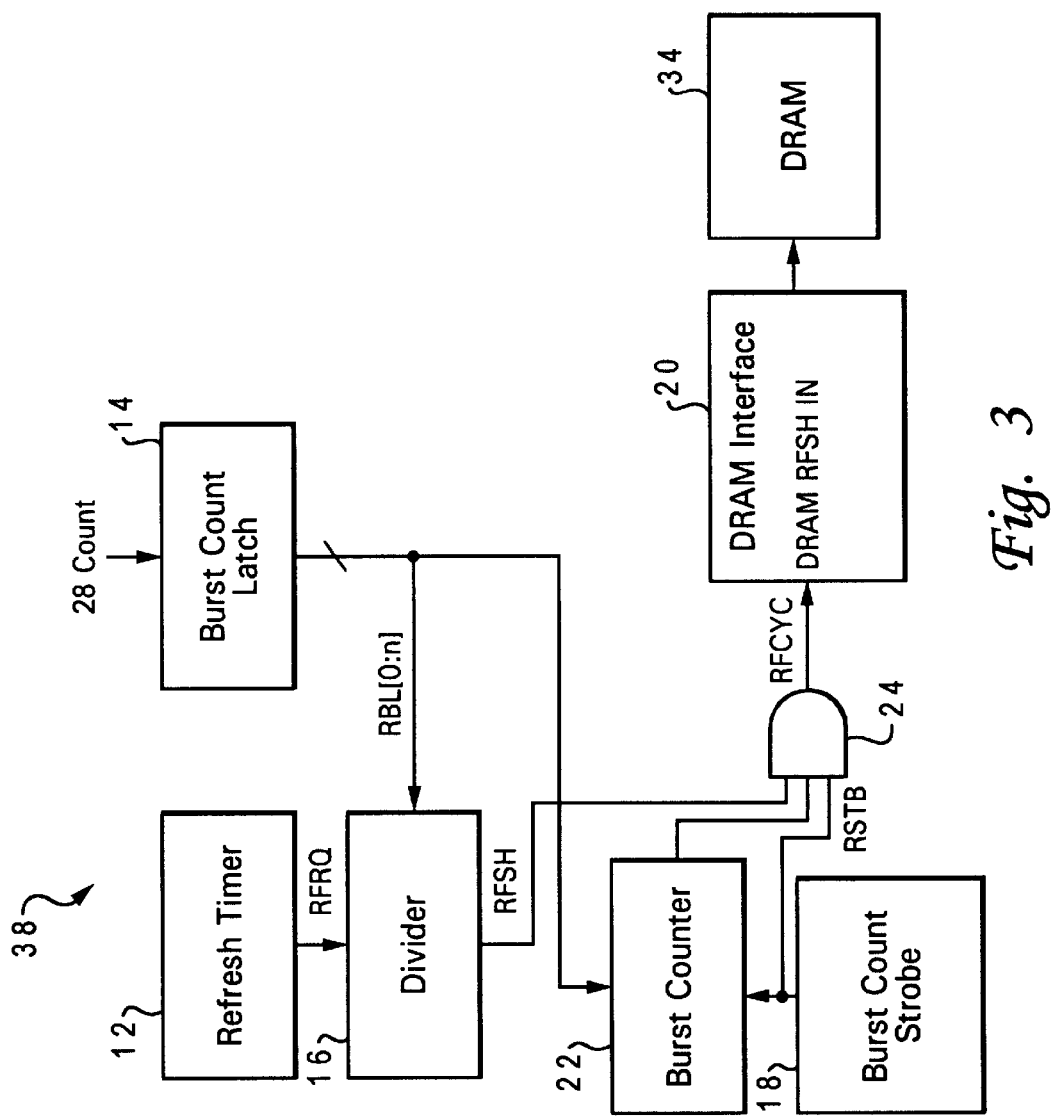
FIG. 3 is an electrical block diagram of a DRAM refresh system in accordance with one embodiment the present invention.

Referring now to FIG. 3, an illustrative embodiment of the Refresh Control 38 is shown. Refresh Timer 12 provides the refresh request signal RFRQ which starts each refresh cycle.

Divider 16 divides the RFRQ signal by a Count 28 value which is written into the Burst Count Latch 14 and provided via the RBL[0:n] signals. Divider 16 is not required for all embodiments, as refresh rates can also be divided by adjusting the count of a software programmable timer, which may be used for refresh request generation in computer systems.

RBL[0:n] represents a count value which reduces the frequency of the refresh requests through operation of Divider 16, and further controls the output rate of Burst Counter 22 to determine the number of refresh cycles that will be generated for each refresh request. Burst Count Strobe 18 generates a signal RSTB which times each refresh cycle. AND gate 24 combines RSTB, the output of the burst counter and RFSH to create RFCYC which causes the DRAM Interface 20 to generate refresh cycles to refresh the DRAM 34.

Figure 4:
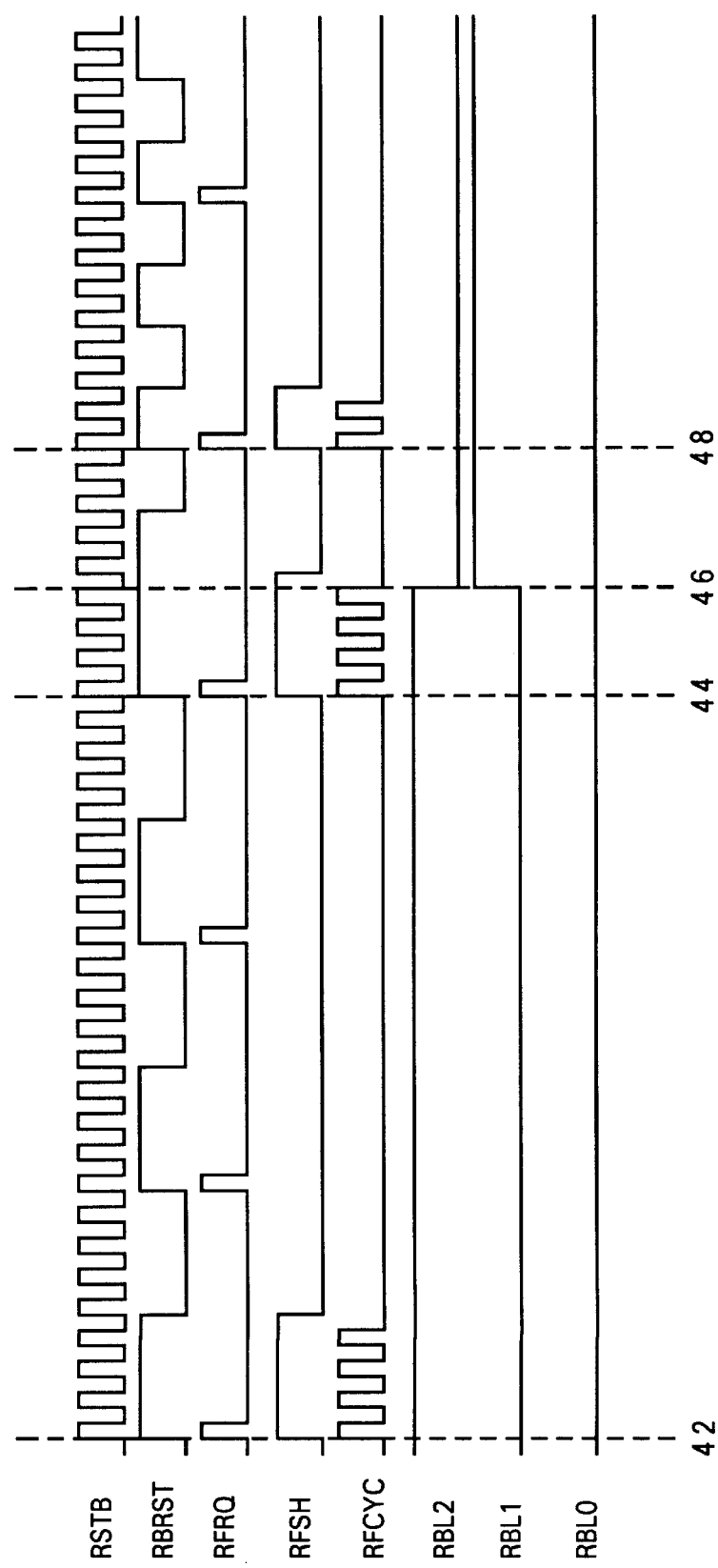
FIG. 4 is an electrical timing diagram depicting signals in accordance with an embodiment of the present invention.

Referring additionally to FIG. 4, the relationship between signals in the Refresh Control 38 is shown. At time 42, RFSH has been asserted by Divider 16. RBL2 is high while RBL1 and RBL0 are low, causing RBRST to be at ¼ the frequency of RSTB. The logical AND of RBRST, RSTB, and RFSH provided by AND gate 24, produces the resulting RFCYC which is a four pulse burst. DRAM Interface 20 then produces appropriate column and/or row strobes to refresh the DRAM 24.

The next burst cycle begins at time 44, when divider 16 has counted the number of RFRQ cycles determined by RBL[0:n]. RFCYC has four pulses as described for the prior cycle above.

At time 46, RBL2 is deasserted and RBL1 is asserted. This changes the burst count value to 2, causing RBRST to be at ½ the frequency of RSTB. The frequency of RFSH changes at the same time to be ½ the frequency of RFRQ. At time 48, RFCYC pulses twice, since RBRST is now at ½ the frequency of RSTB.

FIG. 4 also illustrates the programmable aspect of the present invention. At time 46, Refresh Control 38 has been programmed for a 2 pulse burst. At time 42 it was set for a four pulse burst. However, it is not necessary for Refresh Control 38 to be programmable to practice the invention. RBL[0:n] can be a fixed value, in this type of embodiment, Burst Count Latch 14 will not be present and the Refresh Control 38 will generate a fixed number of refresh cycles to provide an improvement in DRAM subsystem performance by reducing the overhead imposed by having to acquire the bus for every refresh cycle.

Figure 5:
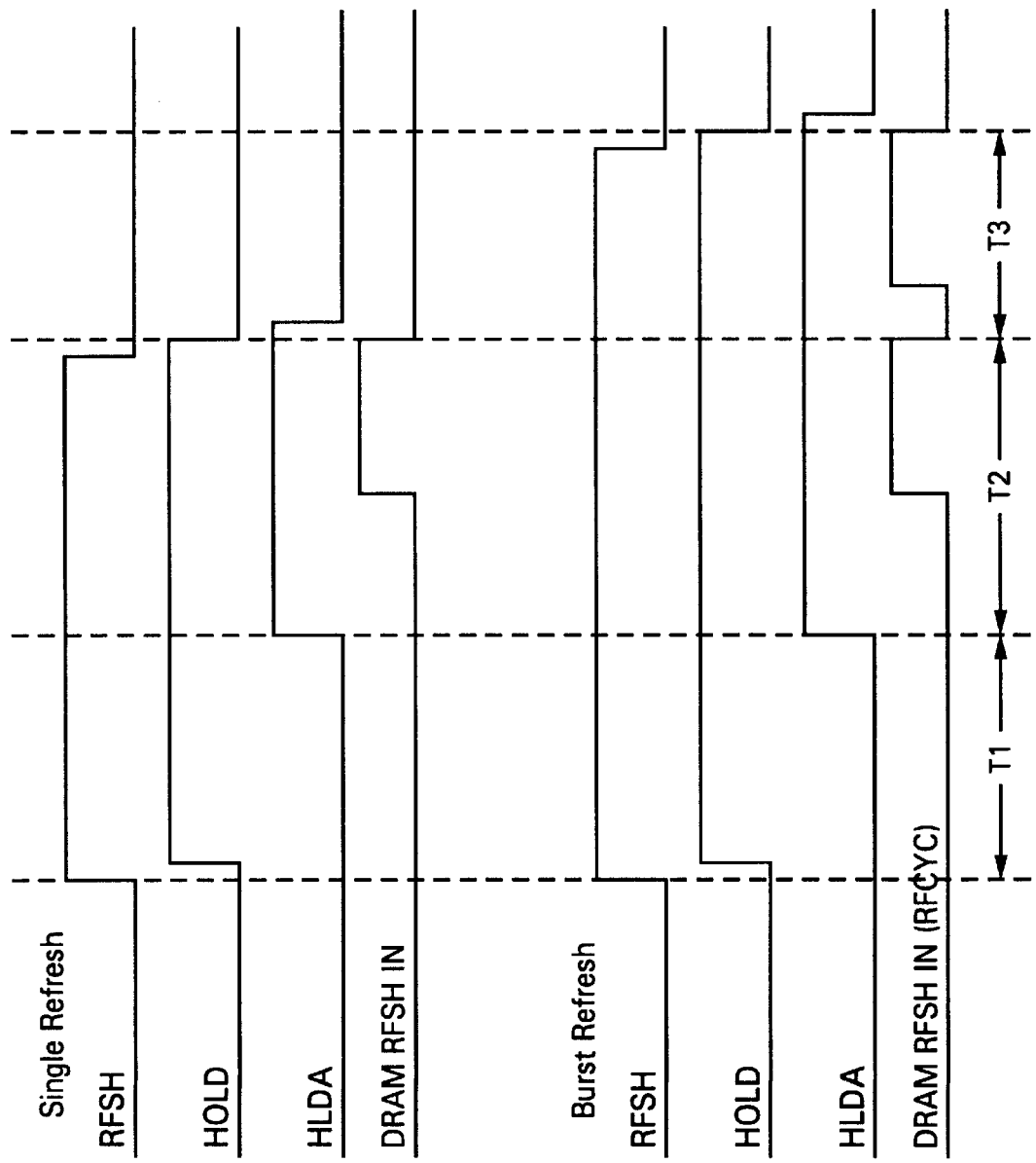
FIG. 5 is an electrical timing diagram illustrating some of the advantages of the present invention.

Referring to FIG. 5, one advantage of the present invention is illustrated. The Single Refresh cycle of prior art circuits is shown in the top portion of the timing diagram. The Burst Refresh cycle of the present invention is shown in the bottom portion. The burst count in this example is 2. The Single Refresh cycle is completed in time T1+T2, as shown in the figure. A 2 cycle burst is complete in time T1+T2+T3. T1 is the time from the generation of a refresh request to the acquisition of the address and data bus AD[0:n] (FIG. 2). The acquisition is defined by the HLDA assertion, which is the acknowledge from all bus users that they are on hold. Time T2 is the time to complete the first burst cycle, which may or may not be longer than the time to complete subsequent burst cycles: T3. As illustrated by the diagram, if T1+T2 is substantially greater than T3, the case in typical computer systems, the use of burst refresh will produce an average refresh time of ½×(T1+T2+T3), which can be extended to T3+1/n×(T1+T2), where n is the number of burst cycles. Thus as n is increased, the average refresh cycle time approaches T3, which is short compared to T1+T2 for a conventional system.

Figure 1:
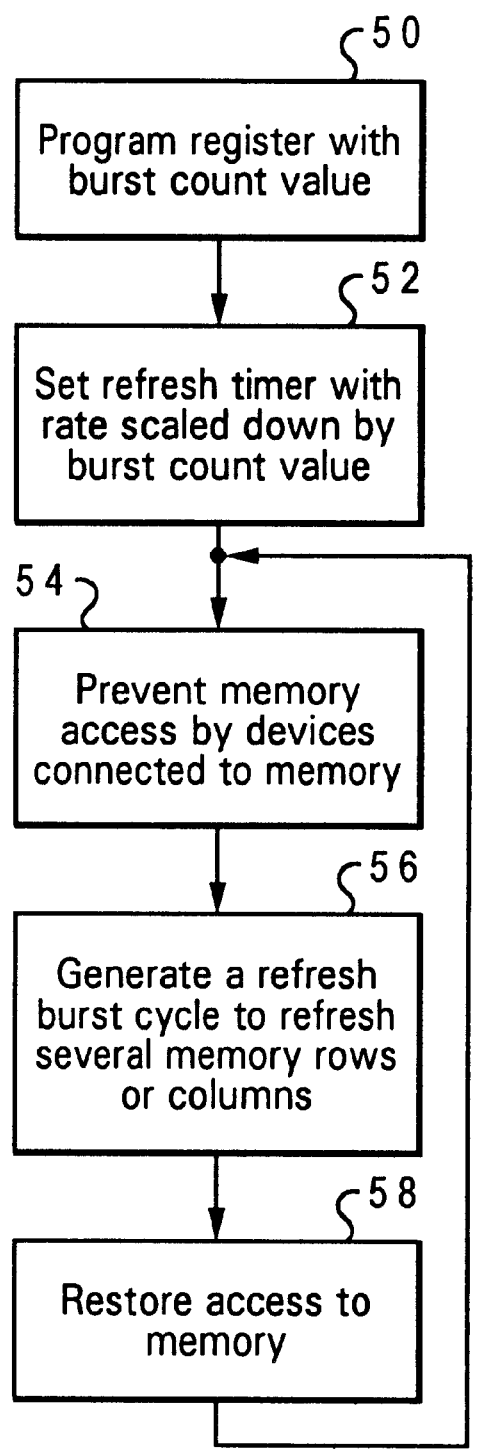
FIG. 1 is a flow diagram of a method for improving DRAM performance in accordance with one embodiment of the present invention.

Referring now to FIG. 1, an example of a method for improving DRAM subsystem performance is illustrated in flow diagram form. A register, burst count latch 14, is programmed with a burst count value, RBL[0:n] (step 50), then the refresh timer 12 is set with a rate which is divided down from a standard refresh rate (step 52). This can be accomplished by software setting a system timer which generates refresh requests or can be part of the hardware implementation of a DRAM controller or other system component which provides refresh requests to the DRAM subsystem. Next, the refresh cycle is begun by preventing access to the memory by other devices 54. A refresh burst cycle is generated to refresh several memory rows or columns (step 56), with a number of counts determined by the count value programmed in step 50. This count is generally a small portion of the entire number of rows in the DRAM, for example a value of 8 would be sufficient to reduce the overhead factor computed above such that time expended acquiring the bus is only 12.5% of what it would be for a single refresh cycle count. Finally, access to memory is restored to the processor 30 and other devices 32 in the system (step 58). This process is repeated at a rate required to maintain the state of the memory, with each subset of the memory being refreshed in sequence until the entire DRAM is refreshed. At that time the refresh sequence starts again, refreshing the subset of memory that was first refreshed.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the invention may be used in a dedicated bus controller integrated circuit that performs many other functions. It is therefore contemplated that such modifications can be made without departing from the spirit or scope of the present invention as defined in the appended claims.

What is claimed is:

1. A method for improving memory subsystem performance comprising, in sequence, the steps of:

programming a register with a burst count value;

preventing access to a memory by one or more devices connected to said memory;

generating refresh cycles from a refresh controller external to said memory, while continuing to prevent access to said memory until a number of refresh cycles equal to said burst count value have been generated; and restoring access to said memory only after said number of refresh cycles have been generated by said refresh controller.

2. The method in accordance with claim 1, further comprising the step of programming a counter with said burst count value.

3. The method in accordance with claim 1, further comprising the step of setting a refresh timer with a period determined by said burst count value.

4. The method in accordance with claim 1, wherein said preventing step, said generating step and said restoring step are performed with a frequency reduced by a factor determined by said burst count value.

5. The method in accordance with claim 4, further comprising the step of setting a refresh timer with a period determined by said burst count value.

6. The method in accordance with claim 4, further comprising the step of programming a counter with said burst count value.

7. The method in accordance with claim 6, further comprising the step of setting a refresh timer with a period determined by said burst count value.

8. The method in accordance with claim 1, wherein said generating step generates refresh cycle to refresh a first subset of memory, and further comprising, in sequence, the steps of:

preventing access to a memory by one or more devices connected to said memory;

generating refresh cycles from a refresh controller external to said memory, while continuing to prevent access to said memory until a number of refresh cycles equal to said burst count value have been generated to refresh a second subset of memory; and restoring access to said memory only after said number of refresh cycles have been generated by said refresh controller.

9. The method in accordance with claim 1, wherein said memory comprises a synchronous DRAM.

10. A memory refresh controller comprising:

memory interface means for coupling an external memory;

timer means for generating refresh requests;

access prevention means for preventing devices from accessing said external memory; and counter means for counting a quantity of refresh cycles to be produced at each refresh request, wherein said quantity of refresh cycles is more than one, but less than the refresh cycles required to refresh all of said external memory, and wherein said access prevention means operates to prevent devices from accessing said external memory until said quantity of refresh cycles is produced.

11. A memory refresh controller in accordance with claim 10 further comprising register means for storing a burst count, wherein said burst count determines said quantity of refresh cycles.

12. A memory refresh controller in accordance with claim 11, wherein said timer means is set with a period determined by said quantity of refresh cycles.

13. A memory refresh controller in accordance with claim 10, wherein an operating frequency of said timer means is reduced by a factor of said quantity of refresh cycles.

14. A memory refresh controller in accordance with claim 10, wherein said timer means is set with a period determined by said quantity of refresh cycles.

15. A memory refresh controller comprising:

memory interface means for coupling an external memory;

timer means for generating refresh requests;

access prevention means for preventing devices from accessing said external memory; and counter means for counting a quantity of refresh cycles to be produced at each refresh request wherein said quantity of refresh cycles is more than one, but less than all of the refresh cycles required to refresh said external memory, and wherein said access prevention means operates to prevent devices from accessing said external memory until said quantity of refresh cycles is produced; and register means for storing a burst count, wherein said burst count determines said quantity of refresh cycles.

16. A memory refresh controller in accordance with claim 15, wherein an operating frequency of said timer means is reduced by a factor of said quantity of refresh cycles.

17. A memory refresh controller in accordance with claim 16, wherein said timer means is set with a period determined by said quantity of refresh cycles.

* * * * *